United States Patent [19]
Kanaoka et al.

[11] Patent Number: 5,770,833
[45] Date of Patent: Jun. 23, 1998

[54] LASER CUTTING METHOD INCLUDING PIERCING A WORK PIECE WITH A MOVING PROCESSING HEAD

[75] Inventors: Masaru Kanaoka; Tooru Murai; Akira Urakawa, all of Tokyo, Japan

[73] Assignee: Mitsubishi Denki Kabushiki Kaisha, Tokyo, Japan

[21] Appl. No.: 786,418

[22] Filed: Jan. 21, 1997

[30] Foreign Application Priority Data

Jan. 30, 1996 [JP] Japan .................................. 8-014225

[51] Int. Cl.$^6$ ................................................ B23K 26/14
[52] U.S. Cl. .............................. 219/121.67; 219/121.71; 219/14.72; 219/121.84
[58] Field of Search ................ 219/121.61, 121.67, 219/121.7, 121.71, 121.72, 121.73, 121.75, 121.78, 121.84, 121.85

[56] References Cited

U.S. PATENT DOCUMENTS

| 5,444,211 | 8/1995 | Nakata et al. | 219/121.67 |
| 5,607,606 | 3/1997 | Mori et al. | 219/121.67 |

FOREIGN PATENT DOCUMENTS

| 3405406 | 8/1985 | Germany | 219/121.84 |
| 54-11593 | 1/1979 | Japan . | |
| 60-240393 | 11/1985 | Japan . | |
| 63-295085 | 12/1988 | Japan | 219/121.72 |
| 2160190 | 6/1990 | Japan . | |
| 3-151182 | 6/1991 | Japan | 219/121.71 |
| 4-200891 | 7/1992 | Japan | 219/121.7 |
| 4319087 | 11/1992 | Japan . | |
| 5123885 | 5/1993 | Japan . | |
| 5987996 | 5/1993 | Japan . | |
| 6198485 | 7/1994 | Japan . | |
| 7-9175 | 1/1995 | Japan | 219/121.71 |
| 788668 | 4/1995 | Japan . | |
| 7-171691 | 7/1995 | Japan | 219/121.71 |

*Primary Examiner*—Teresa J. Walberg
*Assistant Examiner*—Gregory L. Mills
*Attorney, Agent, or Firm*—Sughrue, Mion, Zinn, Macpeak & Seas, PLLC

[57] ABSTRACT

A laser processing method locates a processing head at a piercing start position so that the focal point of the laser beam is positioned above the workpiece surface and offset from a point right above the intended piercing point on the workpiece. While conducting irradiation with the laser beam and jetting of an assist gas, the processing head located at the piercing start position is moved simultaneously both in a direction parallel to the workpiece surface and a direction perpendicular to the workpiece surface such that the focal point approaches the piercing point.

11 Claims, 16 Drawing Sheets

CUTTING DIRECTION

F1000   F3000    F5000

LASER CUTTING METHOD INCLUDING PIERCING A WORK PIECE WITH A MOVING PROCESSING HEAD

FIELD OF THE INVENTION

The invention relates to a laser processing method, as well as to a laser processing apparatus, for effecting processing using the energy of a laser beam.

DESCRIPTION OF THE RELATED ART

FIG. 14 illustrates a conventional laser processing apparatus for conducting processing using a laser beam. Referring to this Figure, a laser beam L emitted from a laser oscillator 1 is guided by a mirror 2 and other elements so as to impinge upon a lens 4 of a processing bead 3 and is focused by the lens 4 on a focal point which is beneath a nozzle 5. The processing head 3 is supplied with an assist gas from an assist gas supply device 6. The assist gas A is jetted from the nozzle 5 coaxially with the laser beam L, whereby a workpiece W is processed.

The processing head 3 is controlled along a plurality of axes such as X, Y and Z along a processing route, by mens of a servo control circuit 7. At the same time, the distance from the end ofthe nozzle 5 to the surface of the work W is detected by means of the gap sensor 8 which is disposed on the nozzle 5 or in the vicinity thereof Based on the data detected by the gap sensor 8, a gap controller 9 controls the level of the nozzle 5 such that the amount of the gap during processing follows a predetermined value.

When conducting piercing on the workpiece W, an NC apparatus 10 as shown in FIG. 14 controls the servo control circuit 7 so as to move the processing head 3 in the direction of the Z-axis, i.e., in the direction of the optical axis, thereby controlling the distance between the end of the nozzle 5 and the surface of the workpiece W. At the same time, a laser oscillation control circuit Il shown in FIG. 14 controls the output level of the laser beam L emitted from the laser oscillator 1, so as to perform laser processing as described below.

In general, laser processing has two steps: i.e., a piercing step which forms a through-hole at a point where the processing is to be started (start portion), and a cutting step for executing cutting in any desired shape starting from the through-hole formed by piercing When the workpiece to be cut by laser is a metallic sheet having a thickness exceeding 32 mm, processing is conducted while jetting oxygen gas as an assist gas simultaneously with the irradiation of the laser beam onto the workpiece. The use of oxygen gas as the assist gas is intended to improve processing efficiency through an oxidizing heat-generating reaction of the workpiece, and is employed when the workpiece to be processed has a large sheet thickness or when a specifically high cutting speed is required. When the workpiece to be processed is a mild steel, the purity of the oxygen supplied during processing becomes an important factor in improving processing performance, and greater importance is given to this factor as the sheet thickness increases. Processing is therefore conducted using a double nozzle which arranges an outlet for the oxygen gas around the nozzle, which then constitutes an outlet for both the beam and assist gas, or a multi-nozzle having a plurality of outlets.

Hitherto, the time required for forming through-hole by piercing has occupied a large portion of the overall processing time of the processing of a thick mild steel sheet. It has therefore been a matter of great significance to shorten the piercing time, in order to improve production efficiency. Proposals have been made to shorten the piercing time. An example of such proposals, disclosed in Japanese Unexamined Patent Publication No. 60-240393, is explained below.

Referring to FIG. 15, numeral 5 denotes a nozzle, L indicates a laser beam, W indicates a workpiece, O indicates the focal point (spot) of the laser beam, and P indicates a piercing position. For the purpose of performing piercing, the focal point O of the laser beam L is set at a position which is upwardly deviated from the workpiece W, and irradiation with the laser beam L and the jetting of the oxygen assist gas are simultaneously conducted so as to heat the piercing point P. The nozzle 5 is then moved towards the surface of the workpiece W. As the nozzle 5 is lowered, the work is heated down to the bottom face thereof to a temperature near the melting point. When the focal point O of the beam L reaches the surface of the workpiece W, hole is instantaneously formed, since the workpiece W has been melted through.

In the conventional laser processing method which employs steps as stated above, too large of a volume of material is made molten due to heating, particularly when the material to be processed is a mild steel of a sheet thickness of 6 mm or greater, with the result that part of the molten metal which is to be discharged downward is undesirably blown upward, i.e., towards the processing head, as the processing head is lowered. FIG. 16 shows, by way of an example of the metal blown upward, molten metal scattered on the material surface as observed when piercing is conducted by a conventional processing method on a mild steel sheet (SS 400) 12 mm thick. In FIG. 16, three illustrations show three different speeds of the processing head, and F 1000 is for 1000 min/min, F3000 for 3000 mm/min and F5000 for 5000 mm/min respectively. As will be seen from FIG. 16, the scattered metal is deposited around the throughhole or made to attach to the portion of the processing head around the nozzle hole. During cutting which is conducted following piercing, there is a risk that the processing head moves across the deposited molten metal around the through-hole, with the result that abnormal reflection and absorption of the laser beam takes place, as well as turbulence in the flow of assist gas, posing a serious problem of degradation in the cutting quality.

The molten metal on the workpiece around the throughbole may be blown upward so as to attach to the nozzle. The nozzle forms the outlet from which the assist gas is jetted. The molten metal deposited on the nozzle causes a non-uniform flow of the gas depending on the direction of the processing. In some cases, the nozzle also plays the role of a sensor for sensing the gap (distance) between the workpiece and the nozzle. In such a case, the nozzle may fail to effectively perform the sensor function due to the presence of deposited molten metal, thus posing another problem.

As mentioned above, a double nozzle having a gas outlet around a central nozzle or a multi-nozzle having a plurality of nozzles may be used for jetting oxygen gas also from the nozzle surrounding the central nozzle, thus achieving higher processing performance and improved product quality. FIG. 17 shows a double-nozzle of the type shown in Japanese Unexamined Patent Publication No. 1-181991. In this Figure, numeral 52 denotes a central nozzle, while 52 designates an outer nozzle. When piercing is performed by lowering a processing head having such a nozzle, the piercing diameter is increased at a region where the inflammable gas is directed, with the result that the amount of the molten metal scattered on the workpiece is tremendously increased, allowing inferior processing in subsequent cutting processing. FIG. 18 illustrates the diameters of the through hole at the upper and lower surfaces of an SS 400 steel sheet of 12 mm thickness when the through hole is formed using a double nozzle. Both piercing diameters are about 2 times as large as those of the through hole formed using a single-hole nozzle.

SUMMARY OF THE INVENTION

An object of the invention is to provide a processing method in which, when a thick sheet of a mild steel is pierced, the molten steel material is deposited in a region which is spaced from the region of the cutting process which is to be conducted subsequent to piercing. At the same time, deposition of the molten steel material on the nozzle is avoided, thus suppressing occurrence of inferior cutting.

Another object of the invention is to provide a laser processing method which employs piercing by means of a double nozzle or a multi-nozzle, improved to reduce the amount of molten metal scattered on the surface of the workpiece.

A laser processing method in accordance with the invention has the steps of: (1) locating a processing head at a piercing starting position such that a laser beam is focused at a focal point spaced from the surface of a workpiece and offset from an intended piercing point intended on the workpiece; and (2) moving, while conducting irradiation with the laser beam and jetting of an assist gas, the processing head located at the piercing start position simultaneously both in a direction parallel to the workpiece surface and a direction perpendicular to the workpiece surface such that the focal point approaches the piercing point.

The invention also provides a laser processing method for cutting a workpiece using a double nozzle including a first nozzle for emitting a condensed laser beam and for jetting an assist gas and a second nozzle provided around the first nozzle so as to surround the first nozzle, the method comprising the steps of: (1) locating a processing head at a piercing starting position where a laser beam is focused at a focal point spaced from a piercing point on the surface of a workpiece; (2) moving, while performing irradiation with the laser beam and jetting of the assist gas only from the first nozzle, the processing head located at the piercing start position such that the focal point is moved towards the piercing point; and (3) jetting, after completion of the piercing, the assist gas from both the first nozzle and the second nozzle.

Other objects and advantages of this invention will become apparent from the detailed description given hereinafter. It should be understood, however, that detailed description and specific embodiments are provided by way of illustration only since various changes and modifications within the spirit and scope of the invention will become apparent to the those skilled in the art from this detailed description.

BRIEF DESCRIPTION OF THE DRAWINGS

In all figures, same and the substantially same elements are given the same reference numbers.

DESCRIPTION OF THE PREFERRED EMBODIMENTS

Embodiment 1

A first embodiment of the present invention will be described with reference to the accompanying drawings.

Figure 1:
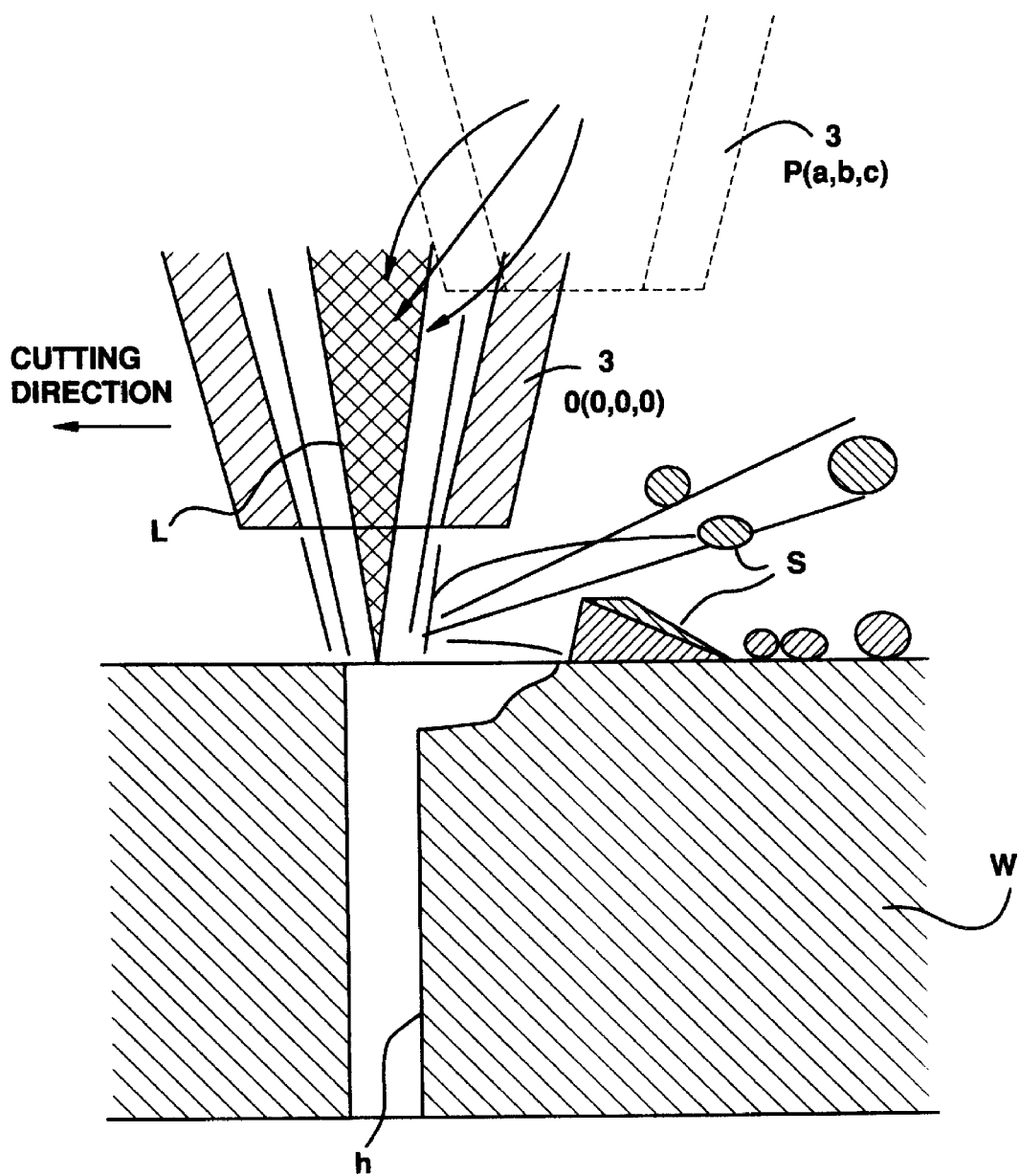
FIG. 1 is a sectional view of a processing machine suitable for carrying out the processing method in accordance with the first embodiment of the invention.
Figure 2:
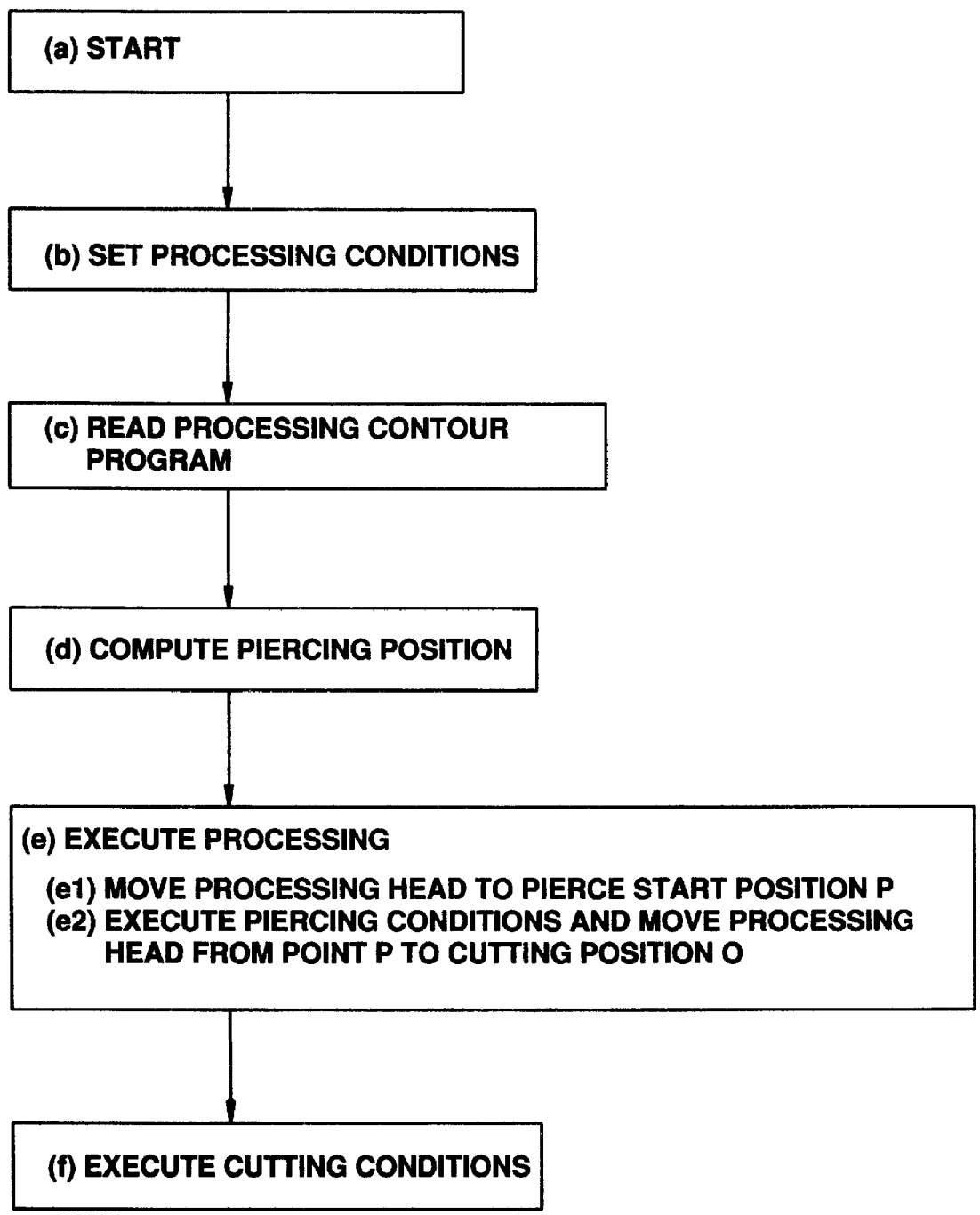
FIG. 2 is an illustration of the operation of the processing machine as shows in FIG. 1.

FIG. 1 is a schematic illustration of the operation of a processing head in accordance with the first embodiment, while FIG. 2 is a flow chart illustrative of the operation of the first embodiment. Referring to FIG. 1, a processing head 3 is set at a point P (a, b, c) such that the focal point is above workpiece W, so that laser beam irradiates a certain area on the surface of the workpiece W so as to heat the workpiece W. After heating the workpiece, the processing head 3 is moved simultaneously both in a vertically downward direction and in a horizontal direction to a point O (0, 0, 0). The direction of the projection on the workpiece surface of the locus of the movement of the processing head 3 in the same plane as the workpiece surface is made to coincide with the direction of cutting which is conducted after piercing. The molten metal S generated in the course of piercing and scattered on the surface of the workpiece W is blown and deposited in the direction which is opposite to the direction X in which the processing head 3 is moved. In the subsequent cutting process in the X direction, therefore, the risk of inferior processing due to the fact that the processing head moves across the deposited molten metal S, is avoided.

Referring to FIG. 2, an NC apparatus 10 commences computation in Step "STARTS" shown as Step (a) and, in Step "SET PROCESSING CONDITIONS", i.e., Step (b), conditions under which the piercing is to be performed, as well as conditions under which the subsequent cutting is to be performed, are read from the data base of the NC apparatus. Step (c), "READ PROCESSING CONTOUR", recognizes the contour of the processing. In Step "COMPUTE PIERCING POSITION", i.e., Step (d), the direction of the cutting which is to be executed after piercing is determined. Based on the cutting direction thus determined, a piercing start position P (a, b, c) is set such that the scattering of the molten metal during the piercing will take place in the direction opposite to the above-mentioned direction of cutting, and the pre-piercing offset amounts or distances X and Z to be traveled by the processing head are determined. Step (e), "EXECUTE PROCESSING", has a sub-step (e1) in which the processing head is moved to the point P (a, b, c) which is deviated by the amounts X and Z from the cutting start point O (0, 0, 0) A subsequent sub-step (e2) moves the processing head from the point P (a, b, c) to the point O (0, 0, 0), while controlling the piercing conditions such as the power, pulse frequency, pulse duty and assist gas pressure. In Step (f), cutting is performed under controlled cutting conditions such as power, pulse frequency, pulse duty and assist gas pressure.

The direction of cutting which is executed subsequently to piercing is recognized by the program block reading function of the NC apparatus 10, and the direction of movement of the processing head is computed based on the recognized direction of cutting. The optimum relationship between the piercing point O and the point P is computed and implemented by the NC apparatus 10 in accordance with the material and thickness of the workpiece W.

In the operation described above, the sequence of the Steps such as (b) "DETECT PROCESSING CONDITIONS" and (c) "READ PROCESSING CONTOUR PROGRAM" may be varied, and the movement of the processing head may be effected by other methods such as "curve interpolation", without hampering the effect produced by the described embodiment.

Figure 3:
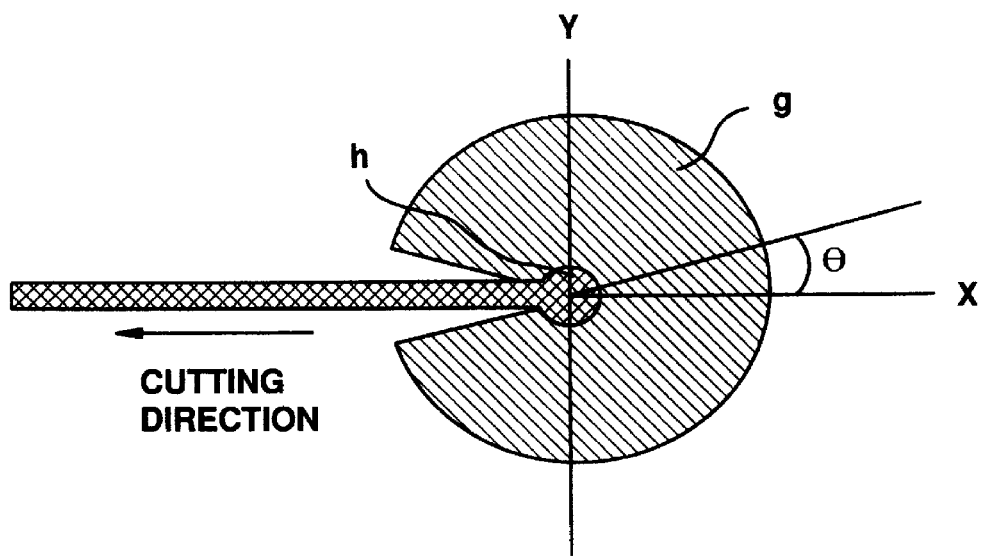
FIG. 3 is an illustration of the results of processing performed in accordance with the invention.
Figure 4:
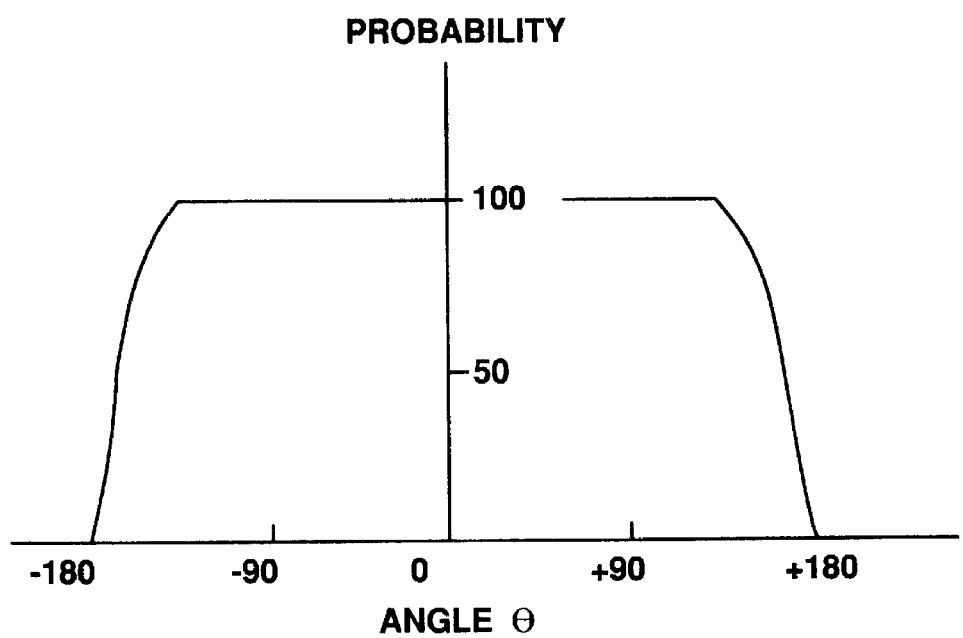
FIG. 4 is a chart showing in acceptable range of conditions under which the invention is carried out.

In the first embodiment as described, the processing head 3 is located such that the focal point is set at point P (a, b, c) above the workpiece W, so as to heat a considerable area on the surface of the workpiece W. The processing head 3 is then moved simultaneously both in vertically downward direction and in a horizontal direction to reach the point O (0, 0, 0). During this movement of the processing head 3, the direction of the projection on the workpiece surface of the locus of the movement of the processing head 3 in the same plane as the workpiece surface is made to coincide with and continue along the direction of the cutting which is conducted after piercing. Actually, however, the cutting is not hampered so long as deposition of the molten metal S scattered in the course of piercing takes place in a region which does not contain the line along which cutting subsequent to piercing is to be executed. FIGS. 3 shows a hole "h" formed by piercing and the direction of cutting to be executed after piercing. The subsequent cutting will not be hampered when deposition takes place within the hatched region "g". FIG. 4 illustrates the probability of satisfactory cutting for a variety of angles θ of movement of the processing head, where the direction of cutting as shown in FIG. 3 is represented as 0° degrees. A mild steel material of a sheet thickness of 16 mm was subjected to 10 cycles of cutting and the probability was determined as the ratio of the number of cutting cycles in which no inferior cutting occurred. As will be seen from FIG. 4, processing can be well performed for almost all directions of pre-piercing downward and horizontal movement of the processing head, provided that the projection on the surface of the workpiece of the locus of movement of the processing head does not overlap the line of the cutting which is to be conducted after completion of piercing.

Embodiment 2

Figure 5:
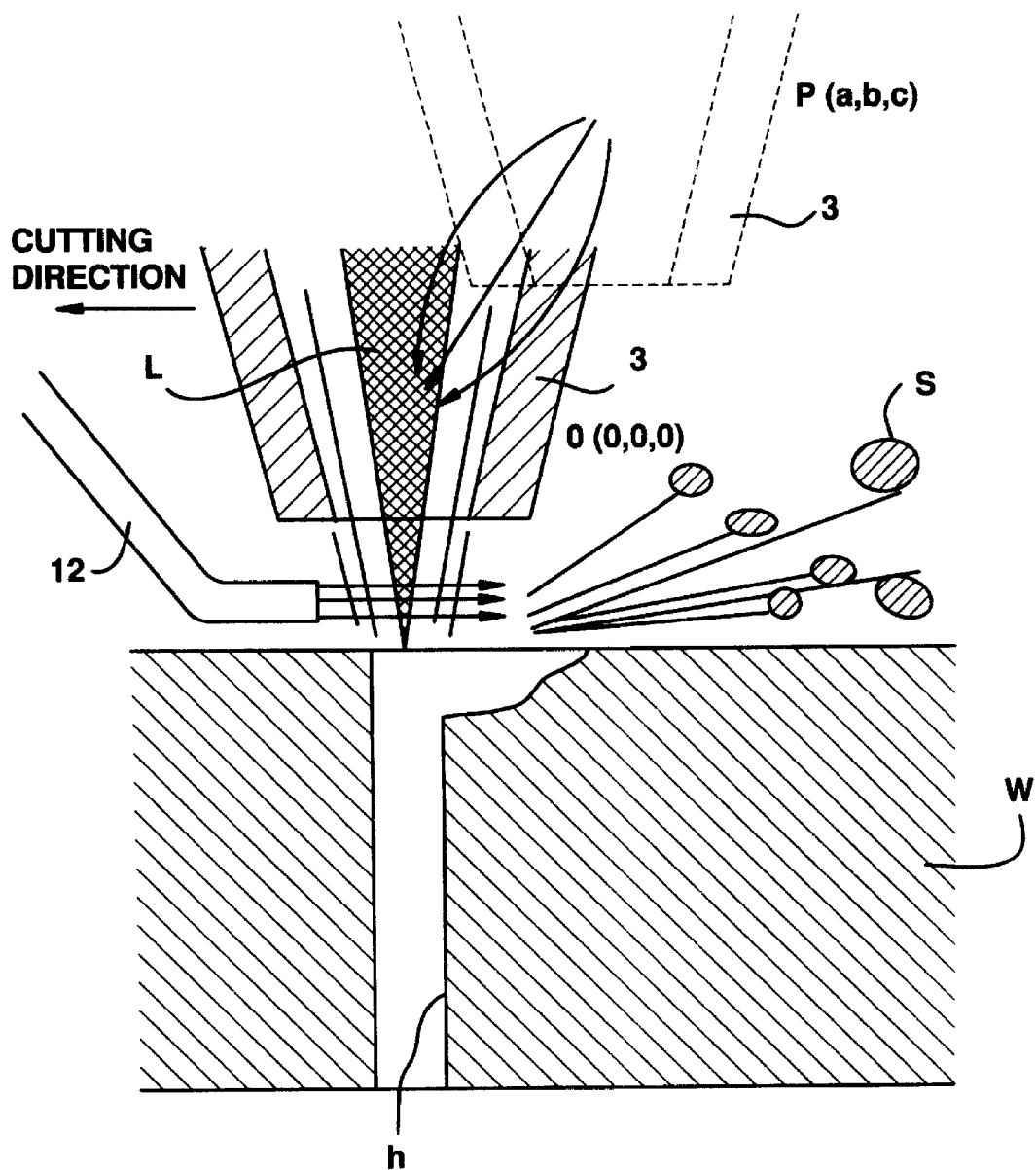
FIG. 5 is a schematic illustration of the motion of a processing head in accordance with the second embodiment of the present invention.
Figure 6:
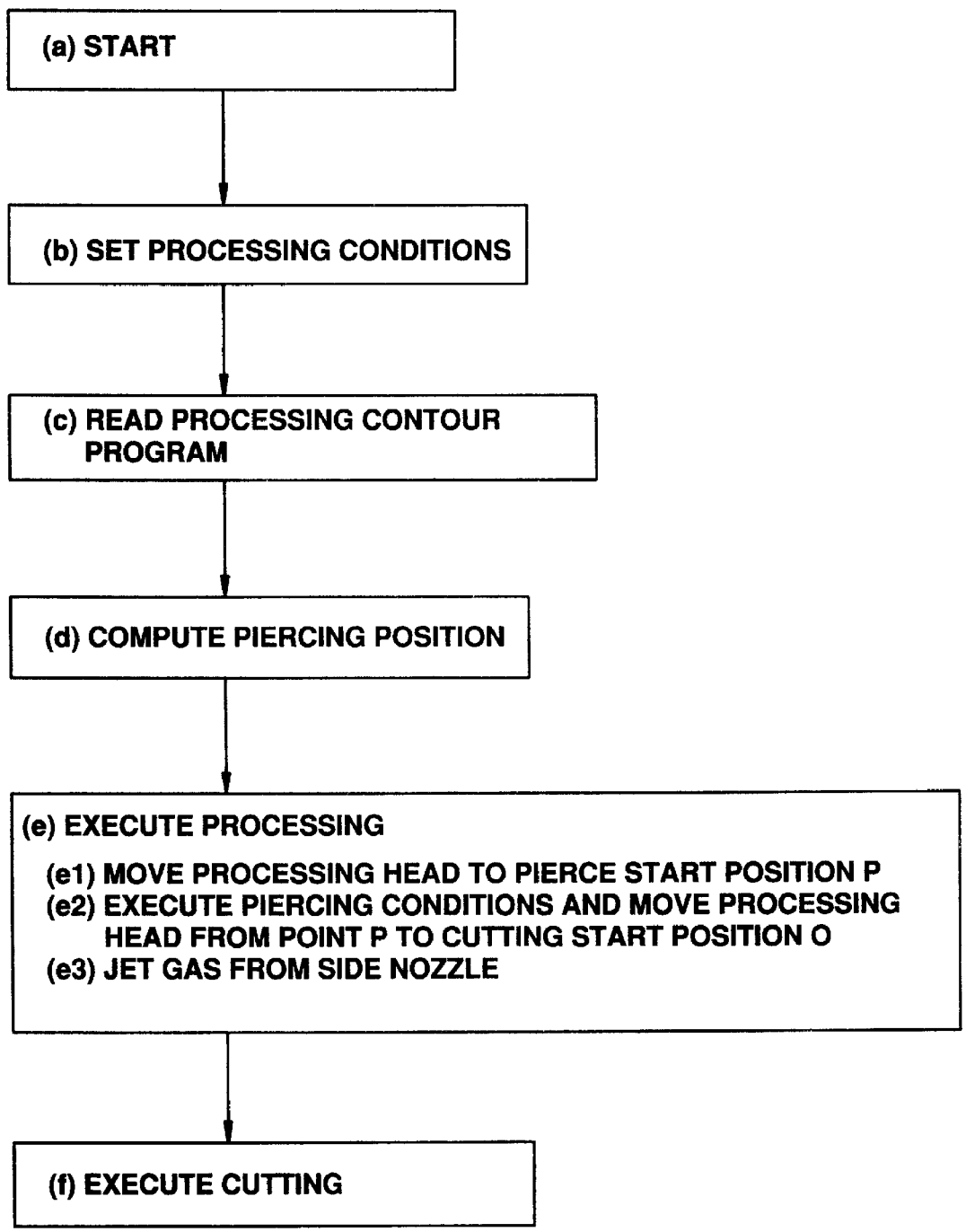
FIG. 6 is an illustration of the operation of the processing machine shown in FIG. 3.

A second embodiment of the present invention will be described with reference to the drawings. FIG. 5 is a schematic illustration of the motion of a processing head in the second embodiment of the invention while FIG. 6 is a chart showing the process of the operation. Referring to FIG. 5, a processing head 3 provided with a side nozzle 12 is located such that the focal point is set above workpiece W so that a considerable area on the surface of the workpiece W is irradiated with laser beam L, whereby the workpiece W is heated. Then, the processing head 3 is moved simultaneously both downward Z and in a horizontal direction X. The direction X is determined so as to coincide with the direction of cutting which is to be conducted after piercing. Molten metal S generated in the course of piercing is scattered and deposited in the direction opposite to the direction X of the movement of processing head. The gas jetted from the side nozzle 12 blows the deposited molten metal S from the region around the hole formed by piercing. In the subsequent cutting processing, therefore, the risk of inferior processing due to processing head movement across the deposited molten metal S is avoided.

Referring to FIG. 6, an NC apparatus 10 commences computation in Step "START" shown as Step (a) and, in Step "SET PROCESSING CONDITIONS", i.e., Step (b), conditions under which piercing is to be performed, as well as conditions under which the subsequent cutting is to be performed, are read from the data base of the NC apparatus. Step (c), "READ PROCESSING CONTOUR PROGRAM", recognizes the contour of the processing. In Step "COMPUTE PIERCING POSITION", i.e., Step (d), the direction of cutting which is to be executed after piercing is determined. Based on the cutting direction thus determined, a piercing start position P (a, b, c) is set such that the scattering of the molten metal during the piercing will take place in the direction opposite to the above-mentioned direction of cutting, and the offset amounts or distances X and Z are determined. Step (e), "EXECUTE PROCESSING", has a sub-step (e1) in which the processing head is moved to the point P (a, b, c) which is deviated by the amounts X and Z from the cutting start point O (0, 0, 0). A subsequent sub-step (e2) moves the processing head from the point P (a, b, c) to the point O (0, 0, 0), while controlling the piercing conditions such as power, pulse frequency, pulse duty and the assist gas pressure. In a sub-step (e3), air is jetted from the side nozzle so as to blow away the deposited molten metal which has been solidified on the surface of the workpiece. In Step (f), cutting is performed under the control of cutting conditions such as power, pulse frequency, pulse duty and assist gas pressure.

In the operation described above, the sequence of the Steps such as (b) "DETECT PROCESSING CONDITIONS" and (c) "READ PROCESSING CONTOUR PROGRAM" may be varied without hampering the effect produced by the described embodiment. The gas blown in Sub-Step (e3) need not be air and any other suitable gas may be used provided that it is inexpensive. It is not necessary that the direction of jetting of the assist gas have a specific relation to the direction of cutting. Namely, jetting of the assist gas in any direction provides an equivalent effect.

Embodiment 3

Figure 7:
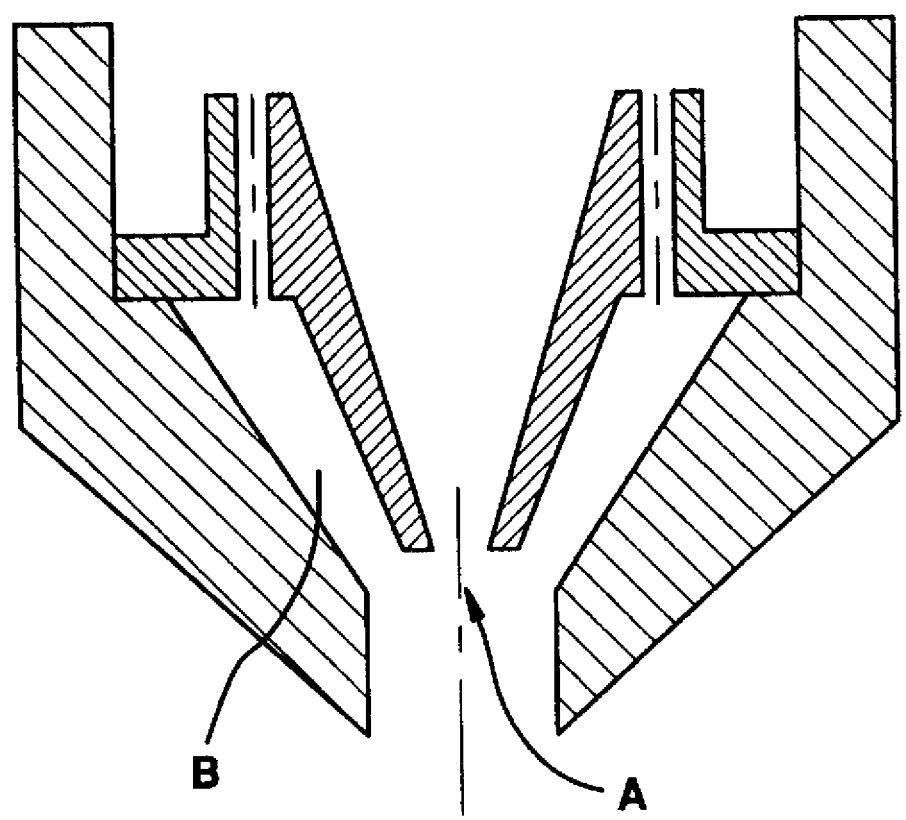
FIG. 7 is a sectional view of a nozzle employed in a third embodiment of the present invention.
Figure 8:
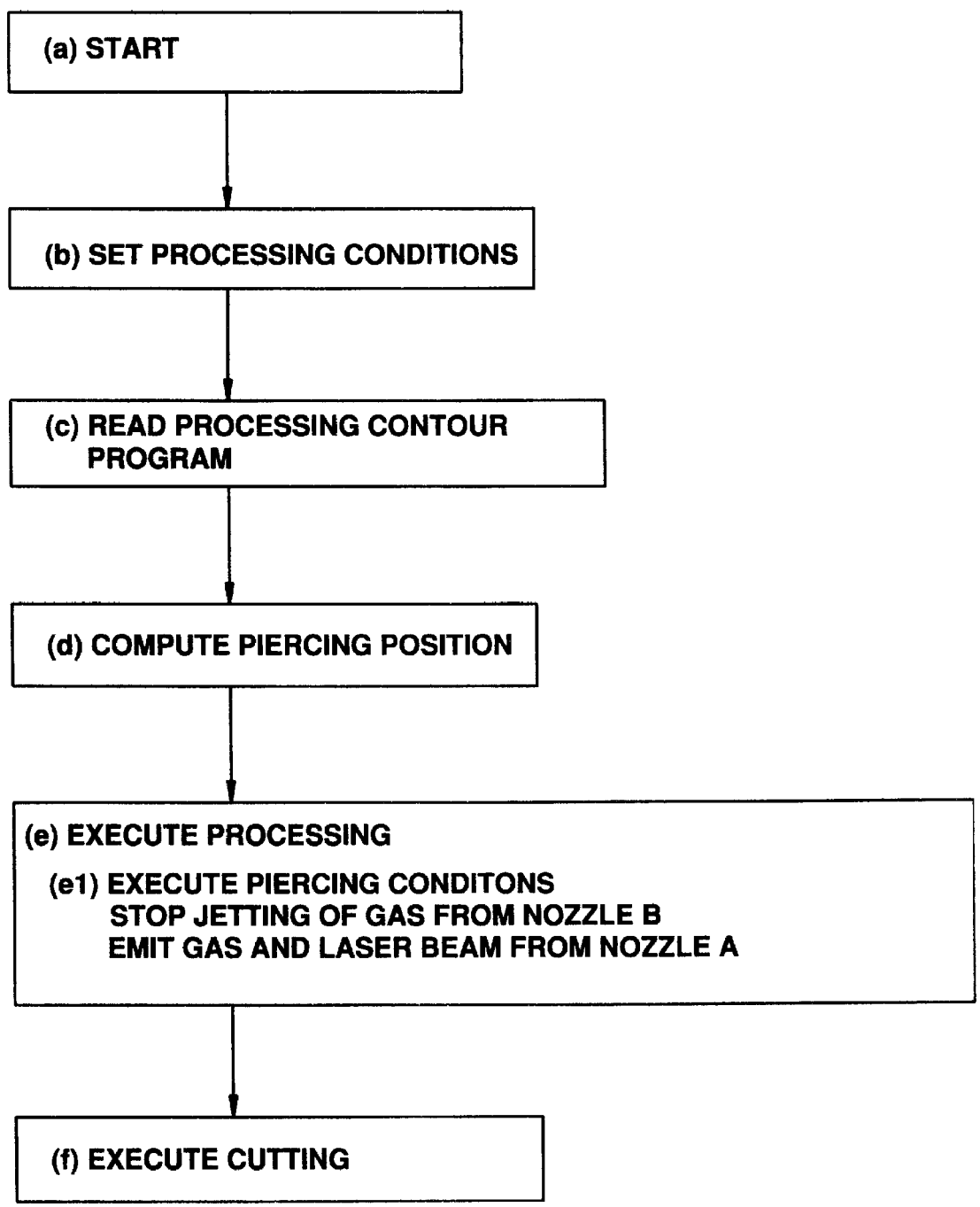
FIG. 8 is an illustration of an example of the operation performed by the processing machine shown in FIG. 5.
Figure 12A:
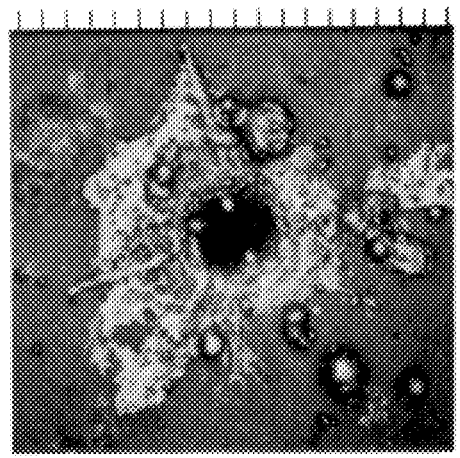
FIG. 12 shows results of processing conducted in accordance with the present invention.
Figure 12B:
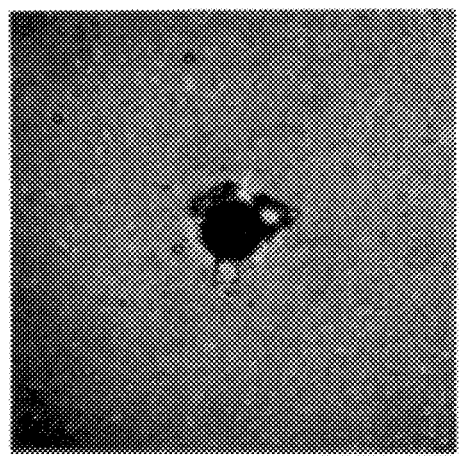
Figure 18A:
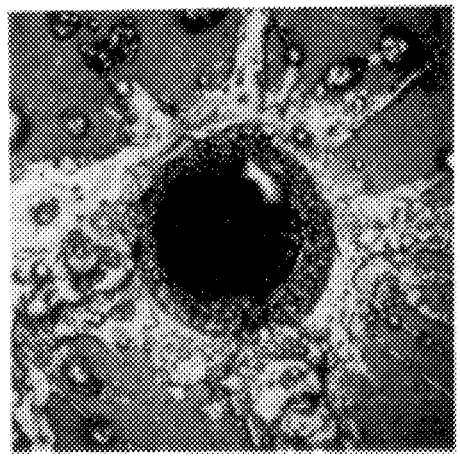
FIG. 18 is an illustration of the results of processing performed in accordance with the conventional processing method.
Figure 18B:
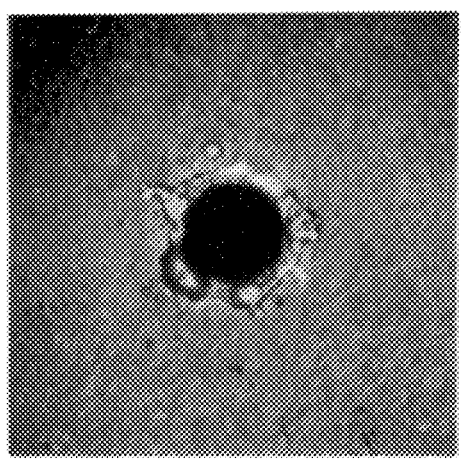

A third embodiment will be described with reference to the drawings. FIG. 7 is a sectional view of a nozzle which is used in cutting sheets of large thickness and which has a first outlet (A) for simultaneously emitting a laser beam and an assist gas and a second outlet (B) for jetting oxygen gas so as to shield the processed portion with oxygen. When a sheet of a large thickness is cut, the oxygen gas jetted from the outlet (B) plays an important role in achieving high cutting speed and a smooth cut surface. In conventional processing methods, oxygen gas is blown constantly both from the first and second outlets (A) and (B) even during piercing. The operation in accordance with this embodiment will be described with reference to FIG. 8. Referring to FIG. 8, an NC apparatus 10 commences computation in Step "START" shown as Step (a) and, in Step "SET PROCESSING CONDITIONS", i.e., Step (b), conditions under which piercing is to be performed, as well as conditions under which the subsequent cutting is to be performed, are read from the data base of the NC apparatus. Step (c), "READ PROCESSING CONTOUR PROGRAM", recognizes the contour of the processing. In Step (d), "SET PIERCING CONDITIONS", a command is read for terminating jetting of the gas from the nozzle outlet (B). Step (e), "EXECUTE PROCESSING", has a sub-step (e1) in which processing is executed by controlling piercing conditions such as power, pulse frequency, pulse duty and assist gas pressure, with the gas jetted only from the outlet (A), while suspending the jetting of the gas from the nozzle outlet (B). In a sub-step (e2), cutting is performed under controlled cutting conditions such as power, pulse frequency, pulse duty and the pressure of the assist gas from the outlet (A), as well as the pressure of the assist gas from the outlet (B). FIG. 12 illustrates the results of processing effected in accordance with the described embodiment on an SS 400 steel sheet of 12 mm thickness. It will be seen that a smaller hole diameter and, hence, better processing can be performed as compared with the conventional technique described in connection with FIG. 18.

In the operation described above, the sequence of the Steps such as (b) "DETECT PROCESSING CONDITIONS" and (c) "READ PROCESSING CONTOUR PROGRAM" may be varied, without hampering the effect produced by the described embodiment.

Embodiment 4

Figure 9:
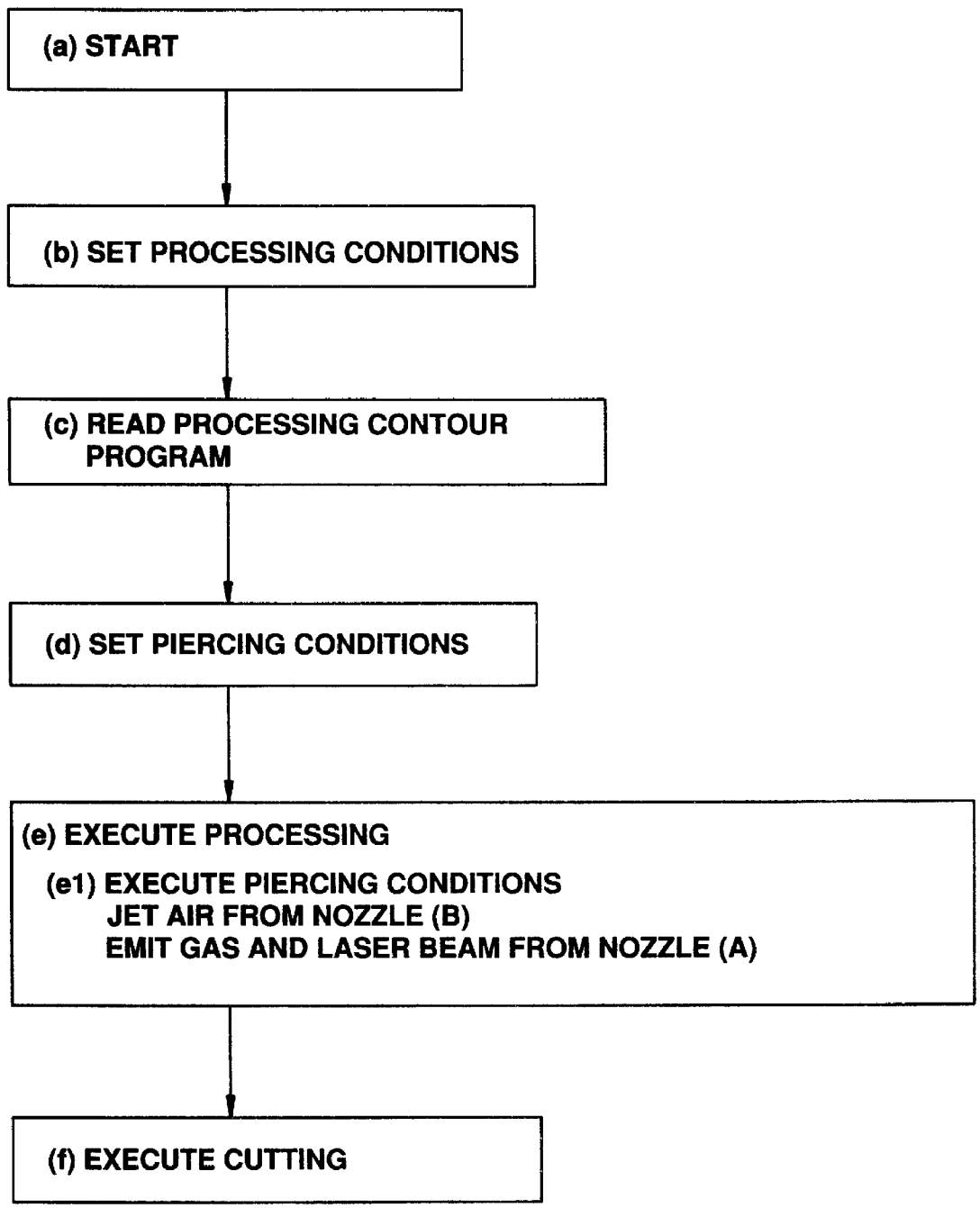
FIG. 9 is an illustration of operation in accordance with a fourth embodiment of the invention.

A fourth embodiment of the invention will be described with reference to the drawings. In the third embodiment which has just been described and which employs a double nozzle, jetting of oxygen from the outlet (B) is suspended during piercing so as to prevent the pierce hole from becoming excessively large. In order to further reduce the hole diameter, it is necessary that a gas which suppresses an oxidation reaction be jetted from the outlet (B). The operation in accordance with this embodiment will be described with reference to FIG. 9. Referring to FIG. 9, an NC apparatus 10 commences computation in Step "START" shown as Stop (a) and, in Step "SET PROCESSING CONDITIONS", i.e., Step (b), conditions under which piercing is to be performed, as well as conditions under which the subsequent cutting is to be performed, are read from the data base of the NC apparatus. Step (c), "READ PROCESSING CONTOUR PROGRAM", recognizes the contour of the processing. In Step (d), "SET PIERCING CONDITIONS", a command in regard to the kind of the gas to be jetted and the pressure of the same is read for terminating jetting of the gas from the nozzle outlet (B). Step (e), "EXECUTE PROCESSING", has a sub-step (e1) in which processing is executed by controlling piercing conditions such as power, pulse frequency, pulse duty and assist gas pressure, with the gas jetted from the outlet (A), while conducting the jetting of the gas from the nozzle outlet (B) in accordance with the gas-type and pressure command. In Step (f), cutting is performed under controlled cutting conditions such as power, pulse frequency, pulse duty and the pressure of the assist gas from the outlet (A), as well as the pressure and/or type of the assist gas from the outlet (B).

In the operation described above, the sequence of the Steps such as (b) "DETECT PROCESSING CONDITIONS" and (c) "READ PROCESSING CONTOUR PROGRAM" may be varied, without hampering the effect produced by the described embodiment. Air, nitrogen gas, argon gas or a mixture of one of these gases and oxygen gas may be used as the gas jetted from the nozzle outlet (B) during piercing, offering equivalent effects.

Embodiment 5

Figure 10:
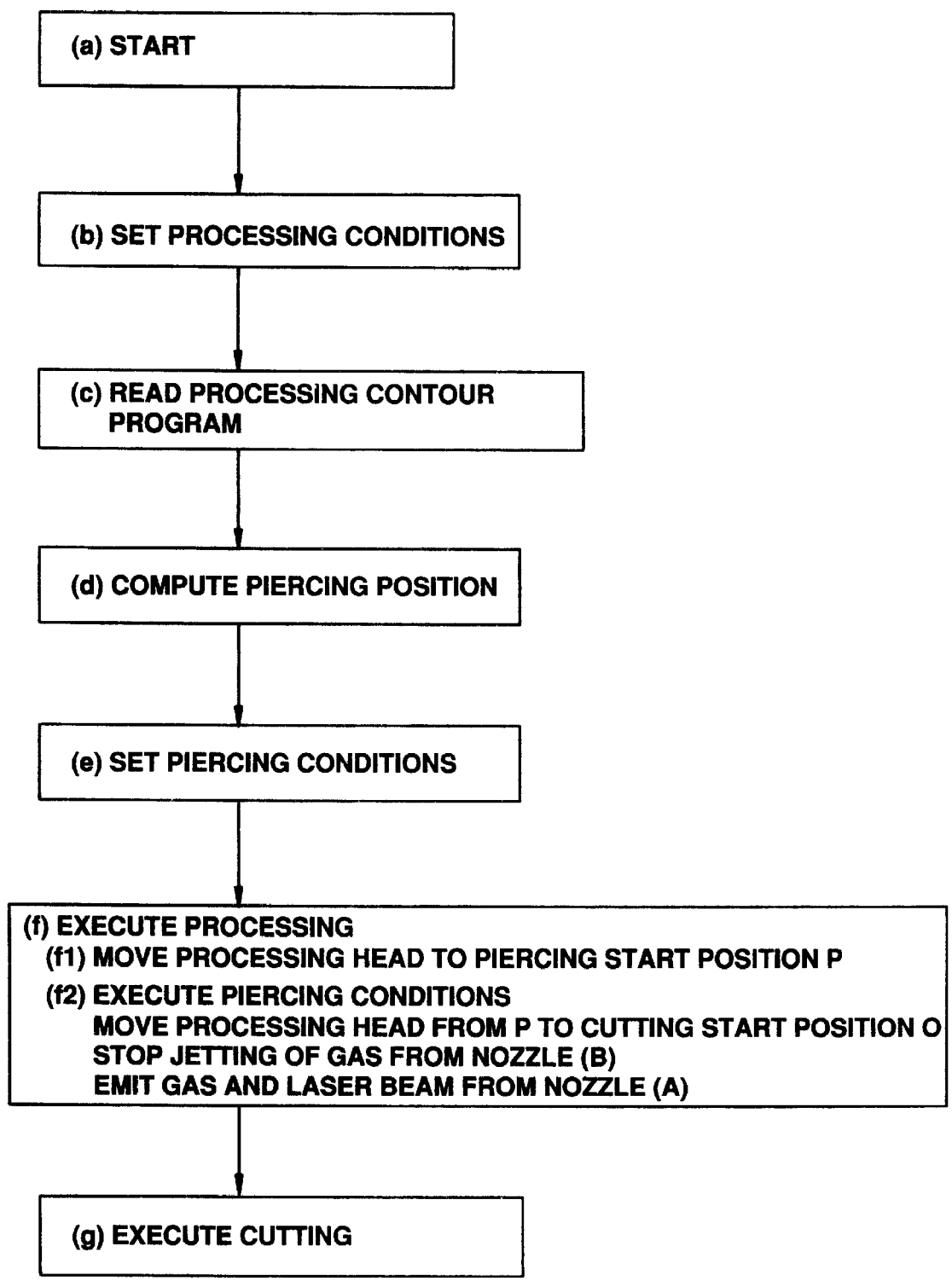
FIG. 10 is an illustration of operation in accordance with a fifth embodiment of the invention.

A fifth embodiment of the present invention will be described with reference to the drawings. FIG. 10 illustrates the operation in accordance with this embodiment. Referring to FIG. 10, an NC apparatus 10 commences computation in Step "START" shown as Step (a) and, in Step "SET PROCESSING CONDITIONS", i.e., Step (b), conditions under which piercing is to be performed, as well as conditions under which the subsequent cutting is to be performed, are read from the data base of the C apparatus. Step (c), "READ PROCESSING CONTOUR PROGRAM", recognizes the contour of the processing. In Step "COMPUTE PIERCING POSITION", i.e., Step (d), the direction of the cutting which is to be executed after the piercing is determined. Based on the cutting direction thus determined, a piercing start position P (a, b, c) is set such that the scattering of the molten metal during piercing will take place in the direction opposite to the above-mentioned direction of cutting, and offset amounts or distances X and Z are determined. In Step (e), "SET PIERCING CONDITIONS", a command is read in regard to the type and pressure of the gas to be jetted from the nozzle outlet (B) to stop the jetting of the gas, i.e., oxygen, from the nozzle outlet (B). Step (f), "EXECUTE PROCESSING", has a Sub-Step (f1) in which the processing head is moved to a point P (a, b, c) which deviates by X and Z from the cutting start position O (0, 0, 0). In a subsequent Sub-Step (f1), the processing head is moved from the point P (a, b, c) to the point O (0, 0, 0) while executing control of the piercing conditions such as power, pulse frequency, pulse duty and assist gas pressure in regard to the nozzle outlet (A) alone. In the meantime, jetting of the gas from the nozzle outlet (B) is not conducted. Step (g) executes the cutting processing. while executing control of the cutting conditions such as power, pulse frequency, pulse duty and assist gas pressure from the nozzle outlet (A), as well as the assist gas, i.e., oxygen, pressure from the nozzle outlet (B).

In the operation described above, the sequence of the Steps such as (b) "DETECT PROCESSING CONDITIONS" and (c) "READ PROCESSING CONTOUR PROGRAM" may be varied, without hampering the effect produced by the described embodiment.

Embodiment 6

Figure 11:
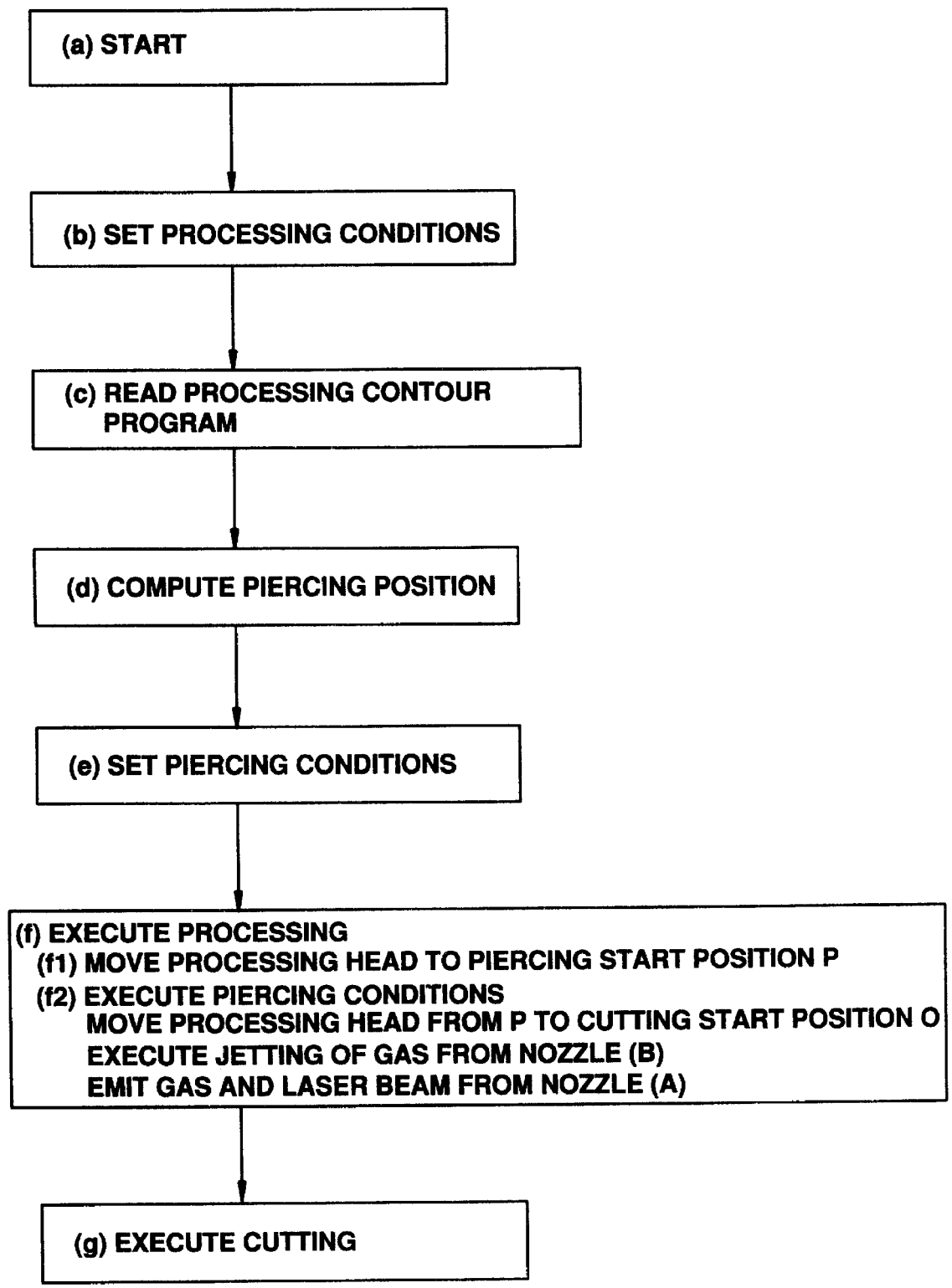
FIG. 11 is an illustration of operation in accordance with a sixth embodiment of the invention.

A sixth embodiment of the present invention will be described with reference to the drawings. In the fifth embodiment which has just been described and which employs a double nozzle, jetting of oxygen from the outlet (B) is suspended during piercing so as to prevent the pierce hole from becoming excessively large. In order to further reduce the hole diameter, it is necessary that a gas which suppresses an oxidation reaction be jetted from the outlet (B). The operation in accordance with this embodiment will be described with reference to FIG. 11. Referring to FIG. 11, an NC apparatus 10 commences computation in Step "START" shown as Step (a) and, in Step "SET PROCESSING CONDITIONS", i.e., Step (b), conditions under which piercing is to be performed, as well as conditions under which the subsequent cutting is to be performed, are read from the data base of the NC apparatus. Step (c), "READ PROCESSING CONTOUR PROGRAM", recognizes the contour of the processing. In Step (d), "COMPUTE PIERCING POSITION", the direction of the cutting which is to be executed after piercing is determined. Based on the cutting direction thus determined, a piercing start position P (a. b, c) is set such that the scattering of the molten metal during piercing will take place in the direction opposite to the above-mentioned direction of cutting, and the offset amounts or distances X and Z are determined. In Step (e), "SET PIERCING CONDITIONS", a command is read in regard to the type and pressure of the gas to be jetted from the nozzle outlet (B) to execute the jetting of the gas from the nozzle outlet (B). Step (f), "EXECUTE PROCESSING", has a Sub-Step (f1) in which the processing head is moved to a point P (a, b, c) which deviates by X and Z from the cutting start position O (0, 0, 0) In a subsequent Sub-Step (f2), the processing head is moved from the point P (a, b, c) to the point O (0, 0, 0) while executing control of the piercing conditions such as power, pulse frequency, pulse duty and assist gas pressure in regard to the nozzle outlet (A), as well as the type and pressure of the gas jetted from the outlet (B). Step (g) executes the cutting processing, while executing control of the cutting conditions such as power, pulse frequency, pulse duty and assist gas pressure from the nozzle outlet (A), as well as the assist oxygen gas pressure from the nozzle outlet (B).

In the operation described above, the sequence of the Steps such as (b) "DETECT PROCESSING CONDITIONS" and (c) "READ PROCESSING CONTOUR PROGRAM" may be varied, without hampering the effect produced by the described embodiment. Air, nitrogen gas, argon gas or a mixture of one of these gases and oxygen gas may be used as the gas jetted from the nozzle outlet (B) during piercing. offering equivalent effects.

According to the processing method of the invention as described, the metallic material deposited and solidified to protrude around the hole formed by piercing of the workpiece W can be removed in a short time so that any inferior processing which may otherwise be caused by the deposited metal can be eliminated. Thus, the gap sensor 8 is capable of accurately detecting the gap between itself and the workpiece W, thus enabling smooth cutting of the workpiece W with stable control of the gap.

Various combinations of features of the several embodiments are possible depending on the material and the thickness of the workpiece, as are the relationships between the conditions of piercing and the conditions of cutting in terms of the height along the Z-axis, laser oscillation power, assist gas pressure and side gas pressure, and have been described as embodiments only by way of examples. It is also to be understood that the sequence of operations conducted under the control of the NC apparatus may be varied insofar as such variation does not hamper the processing.

Embodiment 7

Figure 13:
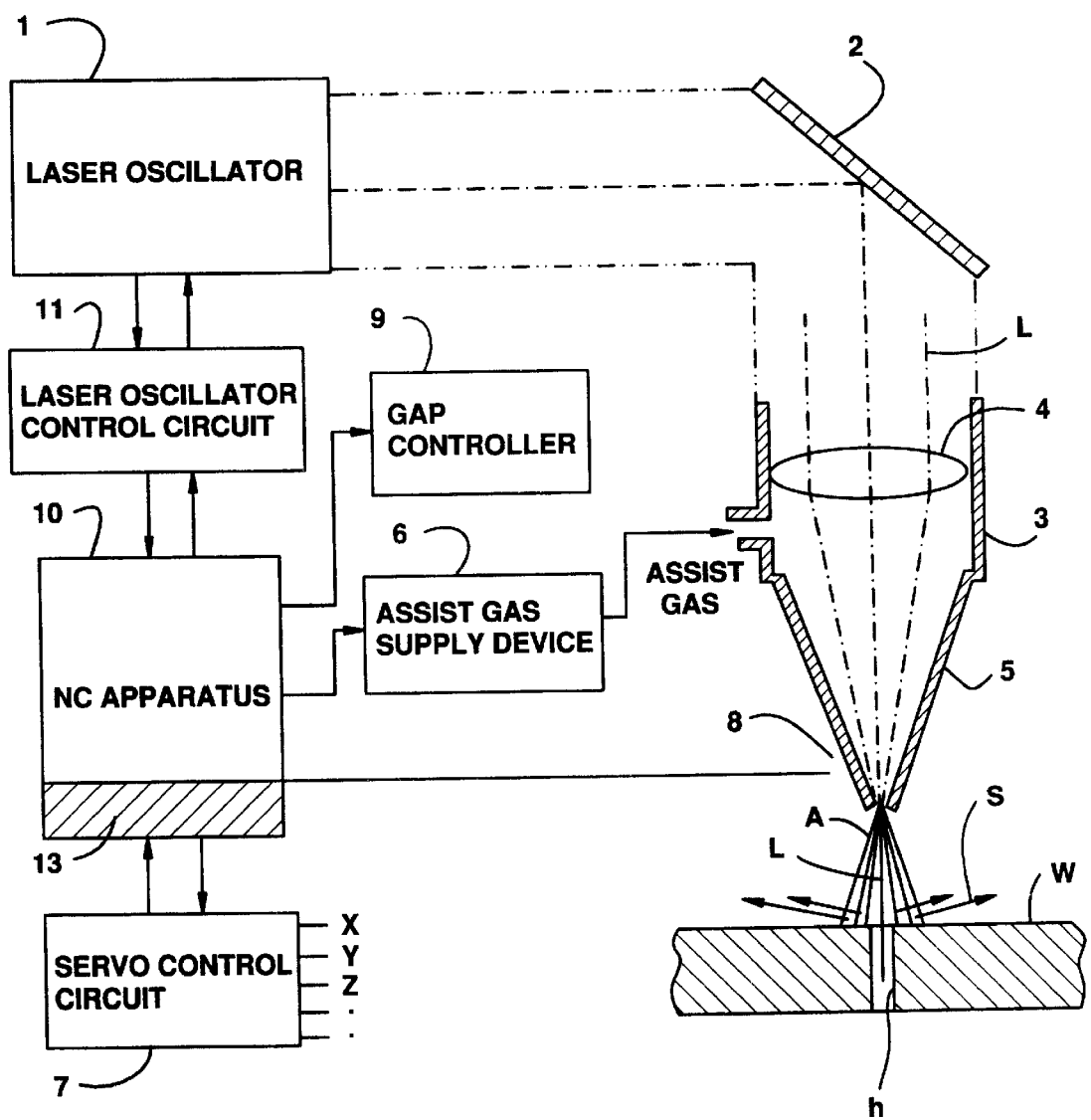
FIG. 13 is an illustration of a processing machine in accordance with the present invention.
Figure 14:
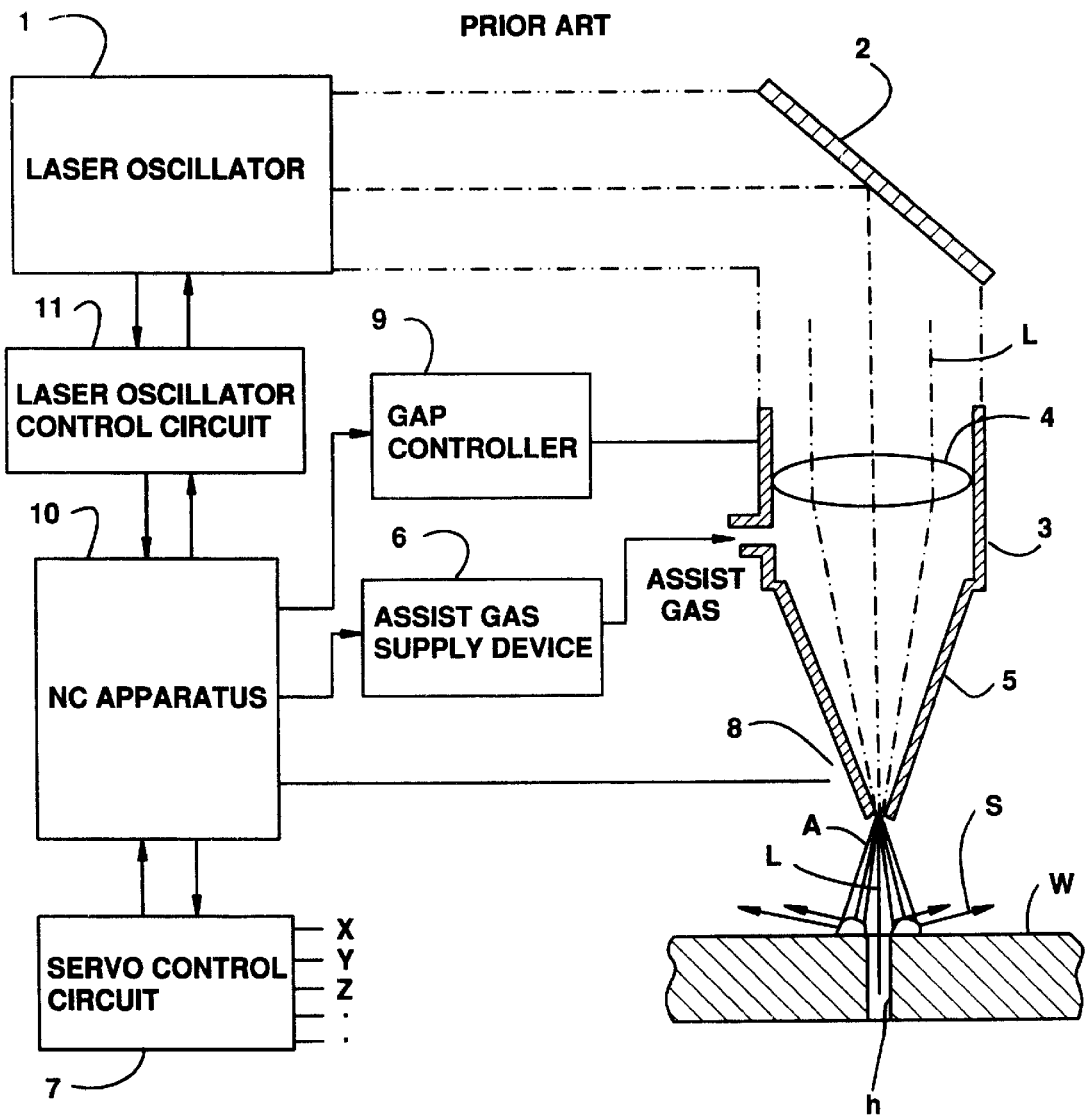
FIG. 14 is an illustration of a laser processing apparatus.
Figure 15:
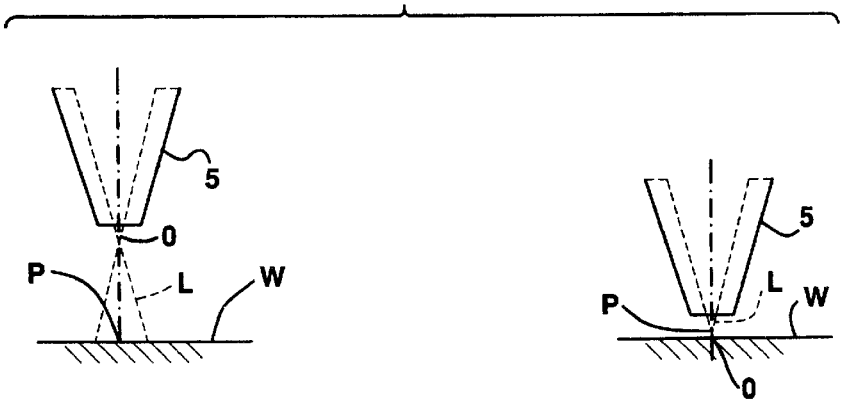
FIG. 15 is an illustration of a conventional processing method.
Figure 16A:
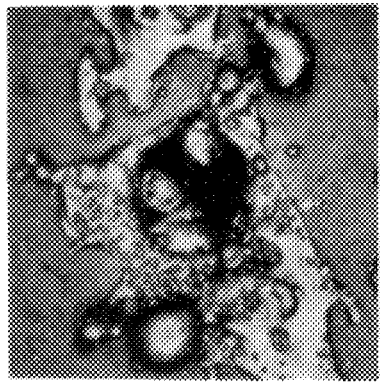
FIG. 16 is an illustration of the results of processing performed in accordance with the conventional processing method.
Figure 16B:
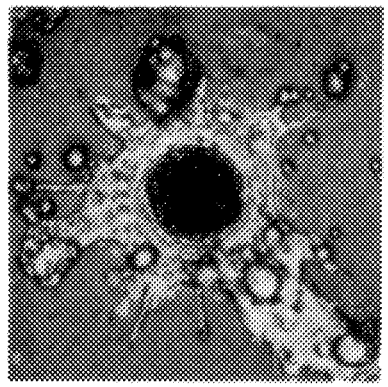
Figure 16C:
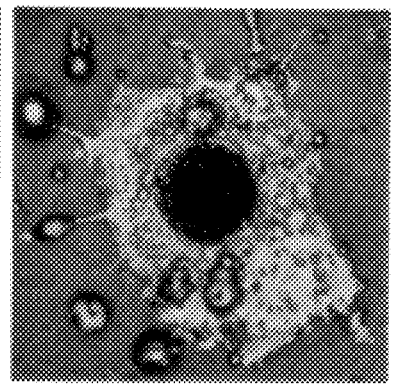
Figure 17A:
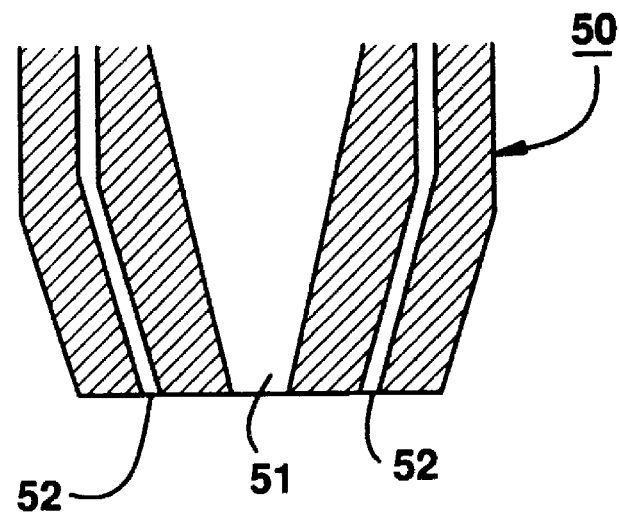
FIG. 17 is an illustration of a conventional laser processing apparatus.
Figure 17B:
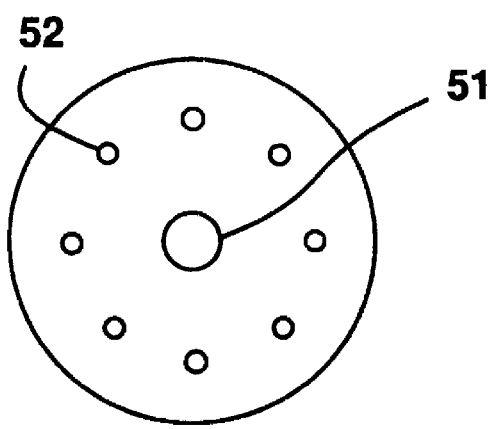

A seventh embodiment of the present invention will be described with reference to FIG. 13. Referring to this Figure, there are shown a laser oscillator 1, a bend mirror 2 for guiding the laser beam, a laser oscillation control circuit 11, an NC apparatus 10 and a piercing position computing circuit 13 provided in the NC apparatus. A function for pre-reading a processing program provided in the NC apparatus 10, computes data such as the piercing position, direction of cutting, material of the workpiece, thickness of the workpiece, and the heightwise position of the processing head, and sets the processing head at an optimum position.

Although in the described embodiment the computing function is provided in the NC apparatus so as to compute the piercing position, this is not exclusive and the same effect can be obtained also when this function is implemented in an automatic programming function for automatically forming the processing program.

These embodiments of the invention having the above-described structure have the following advantages.

Scattering of the molten material of a workpiece, which takes place in the course of piercing conducted as the initial step of a cutting process for cutting the workpiece with a laser beam, is controlled such that the molten metal is scattered in a direction different from the direction in which the cutting proceeds, in order to avoid any defect in the cutting processing which is executed following piercing. When a double nozzle is employed for the purpose of improving the cutting quality, jetting of the gas from an outer nozzle outlet is suspended or, alternatively, a gas such as air, nitrogen gas or argon gas is jetted from the outer nozzle outlet during piercing, so as to prevent the hole formed by piercing from becoming excessively large.

Consequently, the cutting processing following piercing can be properly performed so as to reduce the occurrence of inferior processing, thus ensuring high quality of the processed products.

The invention has been described with respect to certain preferred embodiments. Various modifications and additions within the spirit of the invention will occur to those of skill in the art. Accordingly, the scope of the invention is limited solely by the following claims.

What is claimed is:

1. A laser processing method, comprising the steps of;
   (1) locating a processing head at a piercing starting position where a laser beam is focused at a focal point above a surface of a workpiece and offset from a point above a first point on the workpiece where the laser beam is to pierce the workpiece; and
   (2) conducting irradiation with the laser beam, and, simultaneously, moving said processing head from the piercing start position both in a direction parallel to the workpiece surface and, simultaneously in a direction perpendicular to the workpiece surface such that said focal point approaches said first point.

2. A laser processing method according to claim 1, wherein a side nozzle for jetting a gas in a direction different from that of an optical axis of the laser beam is provided at an end of the processing head, said method further comprising: jetting gas from said side nozzle toward an irradiated portion of the workpiece during or after piercing.

3. A laser processing method according to claim 2, wherein a projection on the workpiece surface of a locus of the movement of said processing head towards said piercing point does not overlap a line of cutting which is to be conducted after the completion of piercing.

4. A laser processing method according to claim 1, wherein a projection on the workpiece surface of a locus of the movement of said processing head towards said piercing does not overlap a line of cutting which is to be conducted after the completion of piercing.

5. A laser processing method for cutting a workpiece using a double nozzle including a first nozzle for emitting a condensed laser beam and for jetting an assist gas and a second nozzle provided around said first nozzle so as to surround said first nozzle, said method comprising the steps of:
   (1) locating a processing head at a piercing starting position where a laser beam is focused at a focal point above a piercing point on a surface of a workpiece;

(2) performing irradiation with said laser beam and jetting of the assist gas only from said first nozzle, while simultaneously moving said processing head, simultaneously in directions parallel and perpendicular to said workpiece surface, from the piercing start position such that said focal point is moved towards said piercing point; and (3) jetting, after completion of piercing, said assist gas from both said first nozzle and said second nozzle.

6. A laser processing method according to claim 5, wherein one of air and nitrogen gas is jetted from said second nozzle during the execution of said moving step.

7. A laser processing method for cutting a workpiece using a double nozzle including a first nozzle for emitting a condensed laser beam and for jetting an assist gas and a second nozzle provided around said first nozzle so as to surround said first nozzle, said method comprising the steps of:

(1) locating a processing head at a piercing starting position where a laser beam is focused at a focal point above a surface of a workpiece and deviated from a point immediately above a first point on the surface of the workpiece where piercing will be accomplished;

(2) conducting irradiation with the laser beam and jetting of assist gas from said first nozzle, while simultaneously moving said processing head from the piercing start position both in a direction parallel to the workpiece surface and, simultaneously in a direction perpendicular to the workpiece surface, such that said focal point approaches said first point; and (3) jetting, after the completion of piercing, an assist gas from both said first nozzle and said second nozzle.

8. A laser processing method according to claim 7, wherein air or nitrogen gas is jetted from said second nozzle during the execution of said moving step.

9. A laser processing method for cutting a workpiece using a double nozzle including a first nozzle for emitting a condensed laser beam and for jetting an assist gas and a second nozzle provided around said first nozzle so as to surround said first nozzle, said method comprising the steps of:

(1) locating a processing head at a piercing starting position where a laser beam is focused at a focal point above a surface of a workpiece and deviated from a point immediately above a first point on the surface of the workpiece where piercing will be accomplished;

(2) conducting irradiation with the laser beam and jetting of assist gas only from said first nozzle, while simultaneously moving said processing head from the piercing start position both in a direction parallel to the workpiece surface and a direction perpendicular to the workpiece surface, such that said focal point approaches said first point; and (3) jetting, after the completion of piercing, an assist gas from both said first nozzle and said second nozzle.

10. A laser processing method according to claim 9, wherein one of air or nitrogen gas is jetted from said second nozzle during the execution of said moving step.

11. A laser processing apparatus comprising:

(1) a means for locating a processing head at a piercing starting position where a laser beam is focused at a focal point above a surface of a workpiece and offset from a point above a first point on the workpiece where the laser beam is to pierce the workpiece; and (2) a means for conducting irradiation with the laser beam, and, simultaneously, moving said processing head from the piercing start position both in a direction parallel to the workpiece surface and, simultaneously in a direction perpendicular to the workpiece surface such that said focal point approaches said first point.

* * * * *